United States Patent
Kumar et al.

(10) Patent No.: US 10,460,960 B2
(45) Date of Patent: Oct. 29, 2019

(54) GAS PANEL APPARATUS AND METHOD FOR REDUCING EXHAUST REQUIREMENTS

(71) Applicant: APPLIED MATERIALS, INC., Santa Clara, CA (US)

(72) Inventors: Ashish Kumar, Sirsa (IN); Vijayakumar Venugopal, Berkeley, CA (US); Niladri Roy, Bangalore (IN); Ramachandra Murthy Gunturi, Bangalore (IN); Andreas Neuber, Stuttgart (DE); Stephen C. Wolgast, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 203 days.

(21) Appl. No.: 15/372,730

(22) Filed: Dec. 8, 2016

(65) Prior Publication Data
US 2017/0322568 A1    Nov. 9, 2017

(30) Foreign Application Priority Data
May 9, 2016    (IN) .............................. 201611016203

(51) Int. Cl.
*H01L 21/67*    (2006.01)

(52) U.S. Cl.
CPC .. *H01L 21/67017* (2013.01); *H01L 21/67288* (2013.01); *Y10T 137/0452* (2015.04)

(58) Field of Classification Search
CPC ......... H01L 21/67017; H01L 21/67288; B08B 5/04; B08B 9/0328; Y10T 137/0452
USPC ..................................................... 137/15.11
See application file for complete search history.

(56) References Cited

U.S. PATENT DOCUMENTS

| | | | | |
|---|---|---|---|---|
| 5,653,807 A * | 8/1997 | Crumbaker | ............. | C23C 16/44 118/715 |
| 5,749,389 A * | 5/1998 | Ritrosi | ................. | B08B 9/0325 134/166 C |
| 5,794,645 A * | 8/1998 | Rohrberg | ............... | F17C 13/003 137/1 |
| 5,915,414 A * | 6/1999 | Seaman | ............ | H01L 21/67017 137/377 |
| 5,992,463 A * | 11/1999 | Redemann | ............... | C23C 16/44 137/240 |
| 6,012,478 A * | 1/2000 | Park | ........................ | F17C 13/04 137/240 |
| 6,202,656 B1 * | 3/2001 | Schmitt | ............. | H01L 21/67023 134/105 |
| 6,293,310 B1 * | 9/2001 | Redemann | ............... | C23C 16/44 137/884 |

(Continued)

*Primary Examiner* — William M McCalister
(74) *Attorney, Agent, or Firm* — Moser Taboada; Alan Taboada

(57) ABSTRACT

Embodiments of a system, a gas panel and method thereof having reduced exhaust requirements for the delivery of gases include distributing an inert gas in at least one interior portion of the gas panel in which a gas to be delivered by the gas panel is present. Embodiments can further include monitoring for leaks in the interior portion of the gas panel and, in response to a detected leak, increasing the distribution of the inert gas in at least the portion of the gas panel in which the leak was detected. Embodiments may further include exhausting gases out of the gas panel. In such embodiments, in response to a detected leak, a rate of the exhausting of the gases is increased. The gas panel can also be sealed to reduce an amount of gas that leaks out of or air that enters into the gas panel.

10 Claims, 12 Drawing Sheets

(56) References Cited

U.S. PATENT DOCUMENTS

| | | | |
|---|---|---|---|
| 6,343,627 B1* | 2/2002 | Hasaka | F17C 5/06 141/18 |
| 6,394,138 B1* | 5/2002 | Vu | C23C 16/44 137/597 |
| 6,409,837 B1* | 6/2002 | Hillman | C23C 16/4486 118/712 |
| 6,474,700 B2* | 11/2002 | Redemann | C23C 16/44 277/616 |
| 6,499,502 B1* | 12/2002 | Girard | F17D 1/04 134/166 C |
| 2001/0013371 A1 | 8/2001 | Redemann et al. | |
| 2002/0020353 A1 | 2/2002 | Redemann et al. | |
| 2002/0046775 A1 | 4/2002 | Redemann et al. | |
| 2003/0131885 A1* | 7/2003 | Birtcher | B67D 7/0272 137/240 |
| 2003/0164225 A1* | 9/2003 | Sawayama | C23C 16/24 156/345.29 |
| 2004/0020599 A1* | 2/2004 | Tanaka | C23C 16/455 156/345.29 |
| 2005/0087072 A1* | 4/2005 | Wodjenski | B01D 53/0446 96/108 |
| 2005/0218003 A1* | 10/2005 | Wang | C25D 7/12 205/157 |
| 2007/0187386 A1* | 8/2007 | Kim | H01L 21/324 219/385 |
| 2008/0141589 A1* | 6/2008 | Farneman | B01J 19/126 48/197 FM |
| 2008/0302434 A1* | 12/2008 | Taskar | F16K 27/003 137/884 |
| 2009/0211525 A1* | 8/2009 | Sarigiannis | C23C 16/4481 118/707 |
| 2010/0263882 A1* | 10/2010 | Bodemann | A62C 35/62 169/17 |
| 2013/0029496 A1 | 1/2013 | Bauer et al. | |
| 2013/0105006 A1* | 5/2013 | Pittroff | C01B 7/20 137/343 |
| 2013/0186180 A1* | 7/2013 | Downing | G01M 3/20 73/40.7 |
| 2013/0252533 A1* | 9/2013 | Mauck | B41J 29/393 454/187 |
| 2013/0309848 A1* | 11/2013 | Young | C30B 25/08 438/478 |
| 2014/0137961 A1* | 5/2014 | Kao | H01L 21/67017 137/561 R |
| 2014/0209177 A1 | 7/2014 | Bauer et al. | |
| 2016/0001391 A1* | 1/2016 | Nacey | B23K 9/325 219/74 |
| 2016/0263591 A1* | 9/2016 | Woo | B05B 1/005 |

* cited by examiner

GAS PANEL APPARATUS AND METHOD FOR REDUCING EXHAUST REQUIREMENTS

CROSS-REFERENCE TO RELATED APPLICATIONS

This application claims benefit of Indian provisional patent application serial number 201611016203, filed May 9, 2016, which is herein incorporated by reference in its entirety.

FIELD

Embodiments of the present disclosure generally relate to gas distribution equipment and more specifically to a gas panel having reduced exhaust requirements.

BACKGROUND

There has been a continuous push to try to reduce the operating costs and energy consumption of gas panels in gas distribution apparatuses used, for example, for the delivery of gases to process chambers. For example, such gas distribution apparatuses can be used to deliver gases to substrate processing systems for microelectronic device and thin-film processing, including but not limited to low temperature epitaxial and polycrystalline deposition processes, high efficiency crystalline silicon PV cell manufacturing for solar implementations, and other substrate processing applications.

Specific opportunities with very low risks to process are highly desirable. The safety exhaust requirements for such gas distribution apparatuses is driven by codes and regulations. Safety exhaust requirements for gas panels contribute significantly when computing the cost and eco-efficiency for the tool. Innovative segregation methods have been developed to provide some level of safety at lower operating costs and reduced environmental impact, however no effective means of reducing the environmental impact while providing significantly lower costs has been achieved. As per environmental impact assessment (SEMI S23), gas panels contribute significantly to the $CO_2$ footprint (indirect emissions) of gas distribution apparatuses.

Therefore, the inventors have provided embodiments of improved gas panel apparatus and methods that may overcome at least some of the aforementioned problems and/or may provide other benefits, as discussed below.

SUMMARY

Embodiments of gas panel apparatus and method therein resulting in reduced exhaust requirements are provided herein. In various embodiments in accordance with the present principles, a method for reducing exhaust requirements of a gas panel includes distributing an inert gas in at least one interior portion of the gas panel in which a gas to be delivered by the gas panel is present, monitoring for leaks in the at least one interior portion of the gas panel and, in response to a detected leak, increasing the distribution of the inert gas in at least the portion of the gas panel in which the leak was detected.

In other embodiments, the method further includes exhausting the gases out of the gas panel and in response to a detected leak, increasing a rate of the exhausting.

In other embodiments the method further includes monitoring a pressure in the at least one interior portion of the gas panel and, in response to a detected pressure change, performing at least one of increasing a distribution of the inert gas or increasing a rate of an exhaustion of gases from the gas panel in at least a portion of the gas panel in which the pressure change was detected.

In other embodiments, the method further includes monitoring a flow rate of an inert gas being distributed into the gas panel and, in response to the flow rate not being at a predetermined level, performing at least one of increasing or decreasing the distribution of the inert gas into the gas panel in at least a portion of the gas panel in which the flow rate was being monitored In other embodiments, the method further includes sealing the gas panel to reduce leaks.

In accordance with an embodiment of the present principles, an apparatus having reduced exhaust requirements associated with the delivery of at least a flammable and/or a toxic gas includes a gas stick to deliver to the apparatus at least one gas to be delivered by the apparatus, a purge module including a purge stick and a plurality of diffusers to distribute an inert gas in at least one portion of the apparatus in which a gas to be delivered by the gas panel is present and at least one sensor for detecting leaks in the apparatus, wherein, in response to a leak detected by the at least one sensor, the distribution of the inert gas by the purge stick and at least one of the plurality of diffusers is increased in at least a portion of the apparatus in which the leak was detected.

In other embodiments, the apparatus further includes an exhaust port and an exhaust pump to exhaust gases out of the apparatus, wherein in response to a detected leak, a speed of the exhaust pump is increased.

In other embodiments, the apparatus further includes a pressure sensor to monitor a pressure in the at least one portion of the apparatus, wherein, in response to a pressure change sensed by the pressure sensor, the distribution of the inert gas by the purge stick is increased in at least a portion of the apparatus in which the pressure change was sensed.

In other embodiments, the apparatus includes an exhaust port and an exhaust pump to exhaust gases out of the apparatus, wherein, in response to a pressure change sensed by the pressure sensor, a rate of an exhaustion of gases from the apparatus is increased in at least a portion of the apparatus in which the pressure change was sensed.

In other embodiments, the apparatus further includes a flow meter to monitor a flow rate of the inert gas distribution, wherein, in response to the flow rate not being at a predetermined level, the apparatus performs at least one of increasing or decreasing the distribution of the inert gas into the apparatus in at least a portion of the apparatus in which the flow rate was being monitored.

In other embodiments, the apparatus further includes at least one of a bottom panel for the apparatus having no inlet holes, grommets installed in gas line inlet and outlet holes on the apparatus, seal washers added to fasteners of the apparatus, couplings for facility inlet and outlet lines, a clean dry air (CDA) lines interface to reduce potential leaks associated with the CDA lines of the apparatus and a cable and connector interface for routing cables and connectors through a slot in the apparatus.

In an alternate embodiment in accordance with the present principles, a system for delivering at least one of a flammable and a toxic gas includes a gas panel including a gas stick to deliver to the gas panel at least one gas to be delivered, a purge module including a purge stick and a plurality of diffusers to distribute an inert gas in at least one portion of the gas panel such that a gas to be delivered by the gas panel is exposed to the inert gas and at least one sensor for detecting leaks in the at least one interior portion of the gas panel. The system further includes a controller including a processor and a memory coupled to the processor, the memory having stored therein instructions executable by the processor which configures the controller to communicate a signal to cause the purge module to distribute an inert gas in the at least one interior portion of the gas panel, to monitor for leaks in the at least one interior portion of the gas panel using signals received from the at least one sensor and in response to a detected leak, to communicate a signal to cause the purge module to increase the distribution of the inert gas in at least the portion of the gas panel in which the leak was detected.

In some embodiments, the gas panel of the system further includes an exhaust port and an exhaust pump to exhaust gases out of the gas panel wherein, in response to a detected leak, the controller communicates a signal to increase a speed of the exhaust pump.

In accordance with an embodiment of the present principles, an apparatus having reduced exhaust requirements associated with the delivery of at least a flammable and/or a toxic gas includes a gas component enclosure to isolate gas delivery components from electrical components in the apparatus. In some embodiments, he gas component enclosure includes a gas stick to deliver to the apparatus at least one gas to be delivered by the apparatus a plurality of diffusers to distribute an inert gas in at least the gas component enclosure of the apparatus in which a gas to be delivered by the apparatus is present and an exhaust port to exhaust gases out of the gas component enclosure to maintain a continuous flow of the inert gas in the gas component enclosure. The apparatus can further include a purge stick to provide inert gas to the apparatus.

In some embodiments, the apparatus can further include at least one sensor to detect leaks in the apparatus, wherein, in response to a leak detected by the at least one sensor, the distribution of the inert gas by the purge stick and at least one of the plurality of diffusers is increased in at least the gas component enclosure.

Other and further embodiments of the present principles are described below.

BRIEF DESCRIPTION OF THE DRAWINGS

Embodiments of the present principles, briefly summarized above and discussed in greater detail below, can be understood by reference to the illustrative embodiments consistent with the present principles depicted in the appended drawings. However, the appended drawings illustrate only typical embodiments of the present principles and are therefore not to be considered limiting of the scope, for the present principles may admit to other equally effective embodiments.

Figure 1:
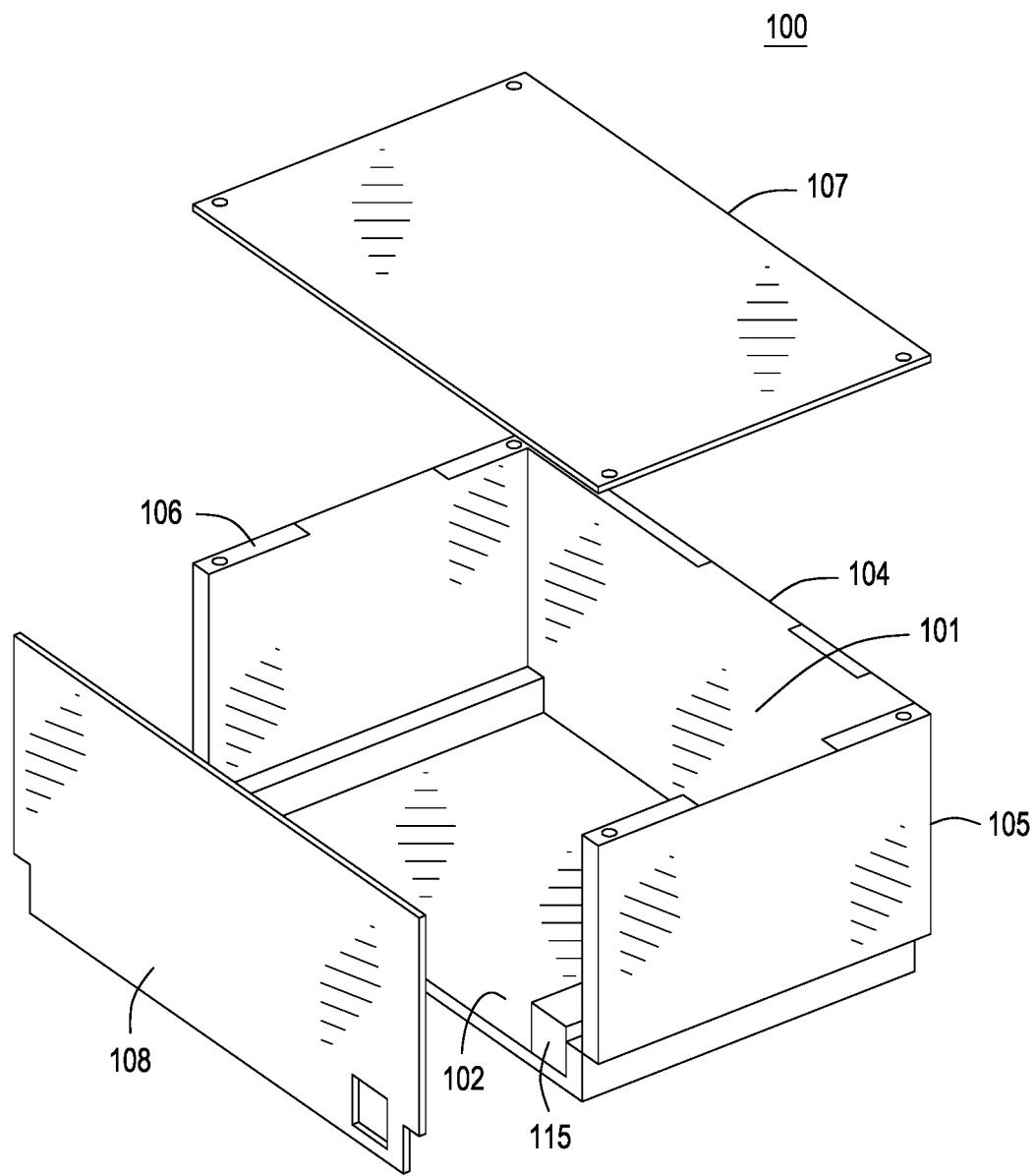
FIG. 1 depicts a three-dimensional pictorial view of a gas panel in accordance with an embodiment of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a gas panel apparatus, system, and methods of fabrication and use thereof are provided herein. In at least some embodiments, a method, apparatus, and system may advantageously provide reduced exhaust requirements for a gas panel, thus, reducing the cost and improving eco-efficiency associated with the gas panel in accordance with the present principles. In principle, the inventors determined that reducing the flammability of pyrophoric (flammable) gases within the gas panel and reducing an interaction of pure toxic gases to be delivered by the gas panel with the outside environment reduces the exhaust requirements of the gas panel, thus reducing costs associated with the gas panel.

Gas panels in gas distribution systems are used for the delivery of various gases, including flammable and toxic gases, for example in the microelectronic device fabrication industry, thus making the system inherently dangerous. Operators of such gas panels can be exposed to toxic gases or can be injured by fire or an explosion caused by the gases in the gas panel. Industry standards mandate that such harms be reduced to some extent by requiring the dilution of the leaked gases within a gas panel by reducing a concentration of gases that escapes the gas panel using, for example, forced or natural airflow. The inventors propose herein a novel gas panel apparatus and system and methods of fabrication and use thereof for reducing exhaust requirements, thus, reducing the cost and improving the eco-efficiency associated with the gas panel. Although various embodiments described herein will be directed to the use of specific inert gases for reducing the flammability of pyrophoric gases and specific sealing techniques, other inert gases, such as noble gases, for reducing the flammability of pyrophoric gases and additional sealing means can be implemented and remain within the scope and concepts of the teachings herein.

All of the functionalities and components of a gas panel will not be described or depicted herein. Only those functions and components of a gas panel necessary to understand the teachings of the present principles herein will be discussed and described below and depicted in the accompanying Figures.

FIG. 1 depicts a three-dimensional pictorial view of an open gas panel 100 in accordance with an embodiment of the present principles. In various embodiments, such as the embodiment of FIG. 1, the gas panel 100 may be a modified version of a commercially available gas panel or any suitable gas panel modified in accordance with the teachings of the present principles. In alternate embodiments of the present principles the gas panel 100 may be a new gas panel designed in accordance with the embodiments described herein.

The gas panel 100 of FIG. 1 illustratively comprises an enclosure defining an inner volume 101 (interior portion) for housing the components of the gas panel 100, which largely include gas sticks (comprising of manual or pneumatic valves, MFCs, pressure regulators, filters etc.) (not shown) for the delivery of gasses, various safety devices/sensors ensuring the safe operation of the gas panel (e.g., differential pressure switch, leak sensor, pressure switches etc.) electrical components, mounting brackets and cables for providing at least power and communications.

The enclosure depicted in FIG. 1 illustratively includes a lower portion 102, a back portion 104, two side portions 105 and 106, a front cover 108 and a top cover 107 to be disposed on the back portion 104 and the two side portions 105, 106 to function as an enclosure cover. In various embodiments of the present principles, seal tape (not shown) will be fixed along the edges of the top cover 107 and the front cover 108 and disposed on the back portion 104 and two side portions 105, 106 to assist in sealing the enclosure to assist in maintaining a sub atmospheric pressure inside the gas panel 100. The gas panel 100 of FIG. 1 further includes a differential pressure switch 115.

Figure 2:
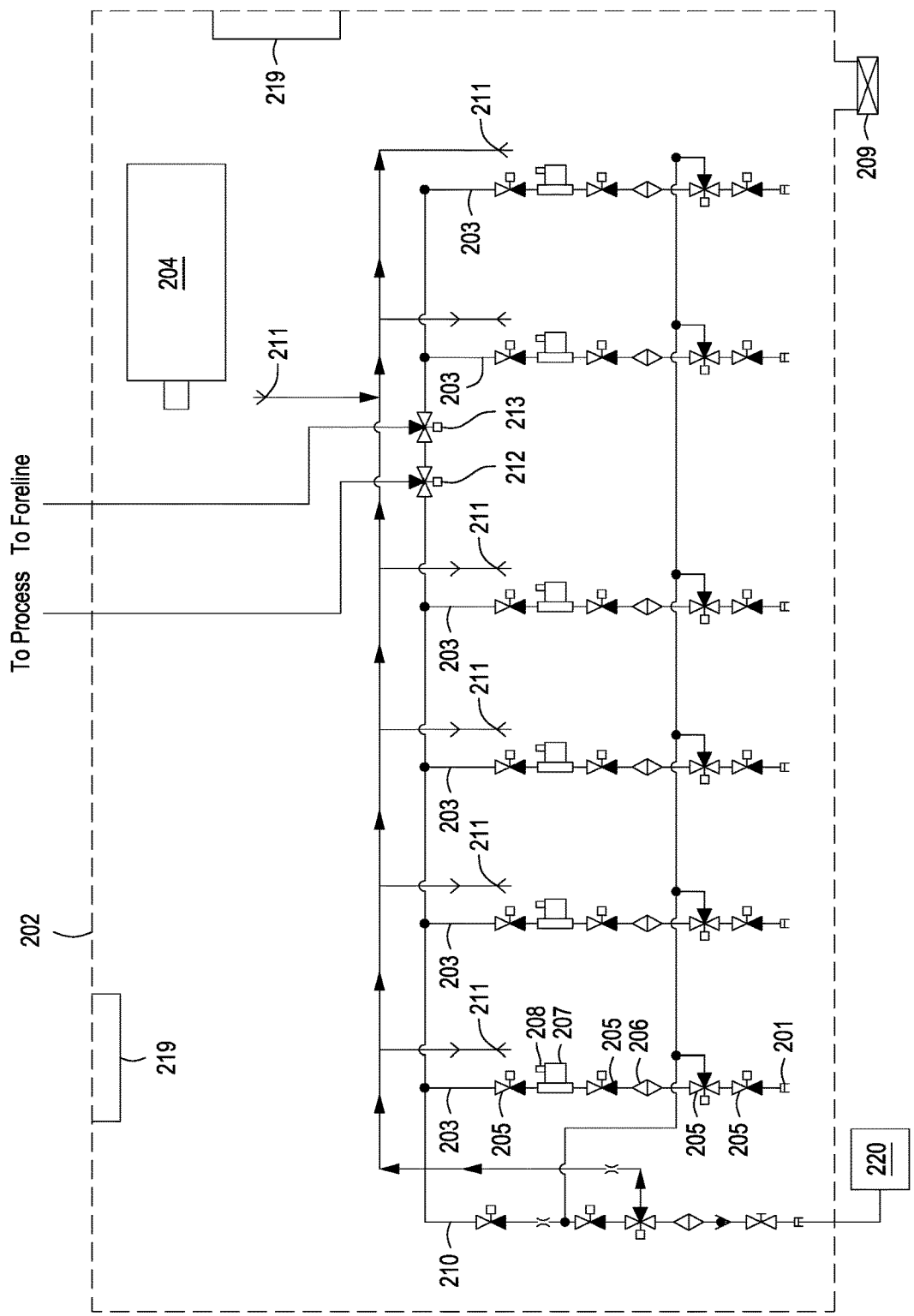
FIG. 2 depicts a schematic diagram of a gas panel including a purge module in accordance with an embodiment of the present principles.

FIG. 2 depicts a high level schematic diagram of a gas panel 200 including a purge module 202 in accordance with an embodiment of the present principles. The purge module 202 of FIG. 2 illustratively comprises a plurality of inert gas diffusers/nozzles, collectively 211, and at least one purge stick 210 for distributing an inert gas in the gas panel 100 in accordance with embodiments of the present principles, as will be described in further detail below. An embodiment of a purge stick 210 in accordance with the present principles is described in detail with reference to FIG. 3. The purge module 202 of FIG. 2 further illustratively comprises a plurality of gas sticks, collectively 203, for receiving a gas to be delivered by the gas panel 100. Each of the gas sticks 203 of FIG. 2 illustratively comprise a gas inlet port 201, a plurality of valves, collectively 205, a filter 206 and a mass flow controller (MFC) 207 having a respective electrical connector 208.

FIG. 2 further includes electrical components 204, for example in one embodiment a power supply, an electronic receiver and a transmitter and the like, for providing at least power, communication and control to the purge module 202 and optionally other components of the gas panel 100. In various embodiments in accordance with the present principles, the electrical components 204 may be included as integrated components of the purge module 202 or in alternate embodiments may comprise a separate component of the gas panel 10. The gas panel 200 of FIG. 2 further includes an exhaust pump 209, which again in various embodiments may be included as a component of the purge module 202 or in alternate embodiments may comprise a separate component. FIG. 2 further depicts a final process valve 212 for controlling delivery of the gas to a process and a foreline valve 213 for controlling delivery of the gas to a foreline. In the embodiment of FIG. 2, the purge module 202 is installed inside the gas panel 100. In various embodiments of the present principles, a location of the purge module 202 in the gas panel 100 is dictated by, from where a supply of an inert gas, such as nitrogen gas, is provided in a gas facility in which the gas panel 100 will be used. For example, FIG. 2 makes reference to a gas facility 220 from which an inert gas, such as nitrogen, can be received. Although in the illustrative embodiment of FIG. 2, the purge stick 210 is depicted as being an integrated component of the purge module 202, in other embodiments in accordance with the present principles, a purge stick 210 can comprise a separate component of the gas panel 100.

Figure 3:
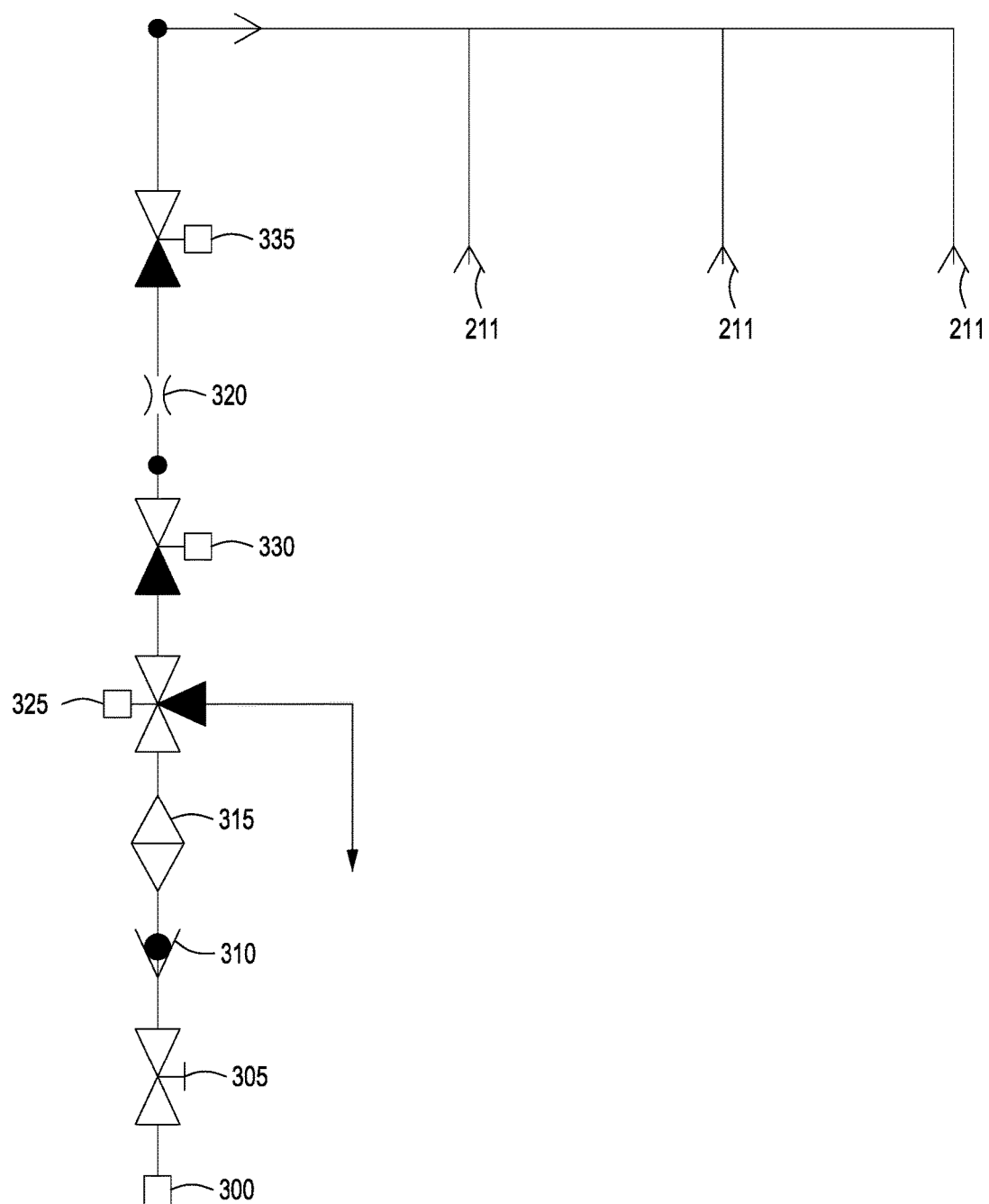
FIG. 3 depicts a schematic view of a purge stick suitable for use in the purge module of FIG. 2 in accordance with an embodiment of the present principles.

FIG. 3 depicts a schematic view of a purge stick 210 suitable for use in the purge module 202 of FIG. 2 in accordance with an embodiment of the present principles. The purge stick 210 of FIG. 3 illustratively comprises a gas inlet port 300, a manual valve 305, at least one check valve 310, a filter 315, a pneumatic valve 325 (sometimes referred to as a purge valve) a flow restrictor 320 and two additional valves functioning as a shut-off valve, for example a 2P valve 330 and a 3P valve 335. The technical specifications (e.g., flow rate) of the flow restrictor 320 depend on a flow rate required to purge the gas panel 100 to maintain an inert environment in the gas panel 100 to reduce a flammability risk associated with a gas in the gas panel 100 in accordance with the present principles. FIG. 3 further depicts a plurality of diffusers 211 (or nozzles) associated with the purge stick 210 to be used for even distribution of an inert gas in the gas panel 100 in accordance with the present principles and as described in more detail below. In some embodiments, the diffusers 211 (or nozzles) can be directed ignition prone areas in the gas panel 100. Such areas can include areas in the gas panel 100 including electrical components.

In operation and with reference to FIGS. 1, 2 and 3, an inert gas, such as nitrogen gas, may be delivered to the gas panel 100 from the gas facility 220 using gas input lines (not shown). The manual valve 305 of the purge stick 210 functions as a lock out/tag out valve and the check valve 310 functions to ensure one direction of flow so that toxic or flammable gas will not reverse back to the gas facility 220. The filter 315 functions to ensure that pure nitrogen gas is purging inside of the gas panel. The last two valves, for example a 2P valve 330 and a 3P valve 335, function as a shut off valve of the nitrogen gas flow in the gas panel 100. In some embodiments, the flow restrictor 320 for the gas panel 100 functions to ensure the correct flow rate for the inert gas purging in the gas panel 100. After the inert gas enters the gas panel 100, the exhaust pump 209 evacuates the inert gas, and any leaked gas to be delivered by the gas panel 100, from the gas panel 100 to ensure a continuous flow of the inert gas in the gas panel 100 by enabling the purging of more nitrogen gas into the gas panel 100 from the gas facility 220. The exhaust pump 209 can also be used to maintain the gas panel in a sub-atmospheric condition.

In accordance with embodiments of the present principles, the purge stick 210 of the purge module 202 of FIG. 2 is implemented to purge the inside of the gas panel 100 with a continuous flow of an inert gas, such as nitrogen gas. An optional sensor (e.g., in one embodiment the differential pressure switch 115 of FIG. 1 described in further detail below) monitors the inside pressure of a gas panel to determine if there is an air leak into the gas panel 100. That is, in various embodiments, an interior portion of the gas panel 100 is exhausted at low rate using the exhaust pump 209 to keep the interior portion of the gas panel 100 in a condition of lesser pressure than outside of the gas panel 100. If air leaks into the gas panel 100, a concentration of oxygen increases in the gas panel 100 thus reducing the concentration of the inert gas in the gas panel. In response to a detected air leak, a distribution of the inert gas into the gas panel 100 can be increased using the purge stick 210 to increase the concentration of the inert gas in the gas panel 100 to attempt to maintain the reduction of the flammability of any pyrophoric gases being delivered by the gas panel 100 and to maintain the dilution of any toxic gases being delivered by the gas panel 100. Optionally, a speed of the exhaust pump 209 can also be increased to more quickly exhaust the gases (inert gas and any leaked gas to be delivered) from the gas panel 100. Such process will be described in greater detail below. In one embodiment, the oxygen concentration inside of the gas panel 100 is maintained below 25% of the LOC value of pyrophoric gases. Such conditions can be maintained by predetermining a necessary flow of the inert gas for achieving such conditions and maintaining such flow of inert gas.

The inventors determined that by purging the inside of the gas panel 100 with inert gas (e.g., a continuous flow of inert gas), such as nitrogen gas, the flammability of pyrophoric gases inside the gas panel is reduced and as such the exhaust requirements for the gas panel is reduced. More specifically, in typical gas panels in the industry, a high amount of air flow is required to reduce the concentration of flammable gas in the gas panel and as such reduce the flammability of gas inside the gas panel. That is, typically, in the industry the flammability of gases within a gas panel dictates an amount of dilution required for the gases in the gas panel and as such a rate of air flow required in the gas panel to achieve such dilution. Such air flow rates can be considerably high depending on the size of the gas panel, flow rate of the flammable gases, number of gas sticks used in the gas panel and also the style of packaging of the gas panel along with the air flow path inside the gas panel. Such high air flow rates can only be achieved by using a high cfm rating of an exhaust pump which consumes a lot of energy. The cfm values of the exhaust pump in typical applications can reach as high as 800 cfm per gas panel depending on the factors described above.

Such high air flow rates come at a high price at least because air flow includes the use of clean room air, which is expensive, and power consumption associated with maintaining such high air flow rates is also expensive. In accordance with embodiments of the present principles, instead of supplying a high flow rate of air in a gas panel to reduce risks associated with flammable and toxic gases in a gas panel, an oxygen deficient inert environment is created by sealing the gas panel and supplying a low amount of an inert gas, such as nitrogen gas, in particular in an area of potential ignition in the gas panel (e.g., in an area where electrical connectors pass through) where the flammable and or toxic gas to be delivered by the gas panel flows. The purging of the gas panel with an inert gas in accordance with the present principles ensures a reduction of or the absence of oxygen in the gas panel which can ignite the pyrophoric gases caused by, for example, an electrical spark from electrical connectors/components. In various embodiments, the inventors have determine that a flow rate of nitrogen gas for purging a gas panel in accordance with the present principles may be as low as 3 CFM.

Therefore, by reducing the flammability of pyrophoric gases in a gas panel in accordance with the present principles and specifically by purging the inside of a gas panel with inert gas, such as nitrogen gas, the exhaust requirements for a gas panel in accordance with the present principles are severely reduced and as such, the operating costs associated with the operation of a gas panel in accordance with the present principles are also reduced. In operation, by reducing the concentration of oxygen in the gas panel by purging the gas panel with an inert gas, such as nitrogen gas, the possibility of igniting pyrophoric gases in the gas panel is reduced and the exhaust requirements (dilution) are also reduced. For example, by reducing the concentration of oxygen in the gas panel by purging the gas panel with an inert gas, such as nitrogen gas, the possibility of igniting pyrophoric gases in the gas panel from an electric discharge (e.g., electric spark) from an electrical connector in the gas panel is reduced.

Figure 4:
FIG. 4 depicts a high level block diagram of a gas panel system in accordance with an embodiment of the present principles.

FIG. 4 depicts a high level block diagram of a gas panel system 400 in accordance with an embodiment of the present principles. The gas panel system 400 of FIG. 4 illustratively comprises a controller 404 and a gas panel 100 in accordance with an embodiment of the present principles. In the gas panel system 400 of FIG. 4, the controller 404 communicates with a purge module (not shown) of the gas panel 100 via electrical components (e.g., referring back to FIG. 2, the electrical components 204).

Figure 5:
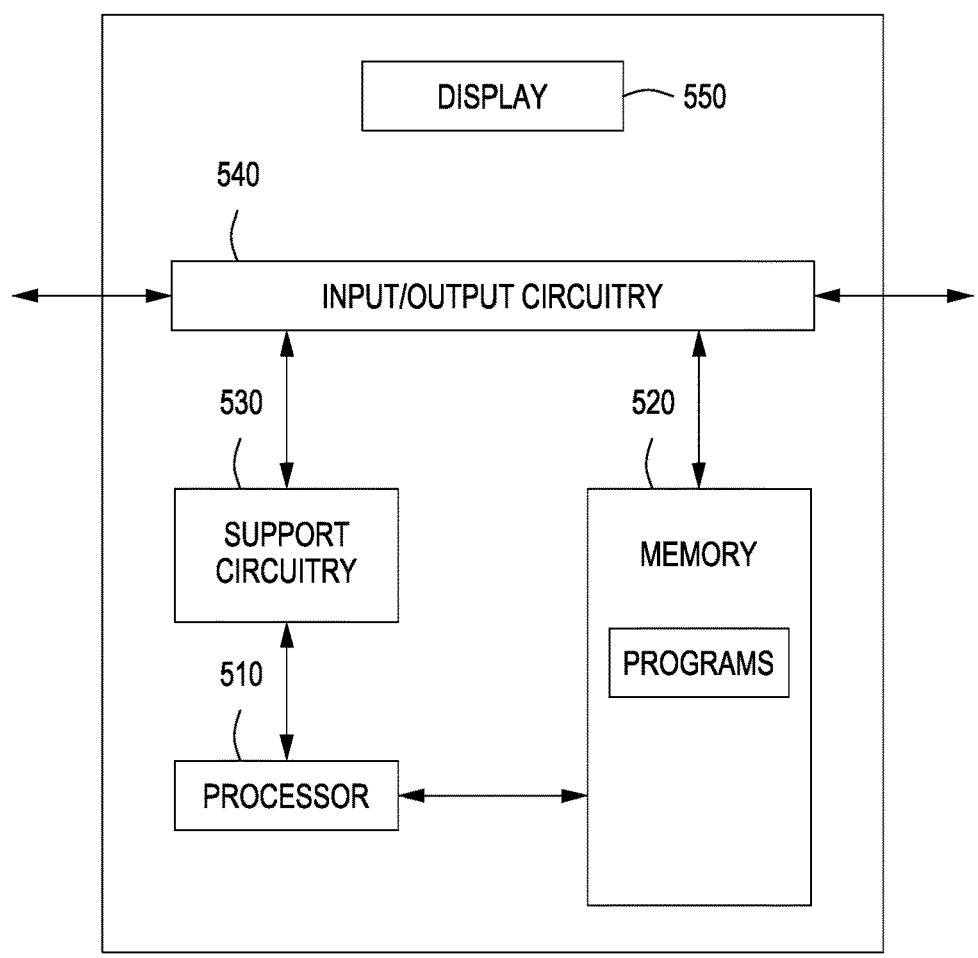
FIG. 5 depicts a high level block diagram of a controller suitable for use in the gas panel system of FIG. 4 in accordance with an embodiment of the present principles.

FIG. 5 depicts a high level block diagram of a controller suitable for use in the gas panel system 400 of FIG. 4 in accordance with an embodiment of the present principles. The controller 404 of FIG. 5 comprises a processor 510 as well as a memory 520 for storing control programs, buffer pools and the like. The processor 510 cooperates with support circuitry 530 such as power supplies, clock circuits, cache memory and the like as well as circuits that assist in executing the software routines/programs stored in the memory 520. As such, some of the process steps discussed herein as software processes may be implemented within hardware, for example, as circuitry that cooperates with the processor 510 to perform various steps. The controller 404 also contains input-output circuitry 540 that forms an interface between the various functional elements communicating with the controller 404. As depicted in the embodiment of FIG. 5, the controller 404 can further include a display 550.

Although the controller 404 of FIG. 5 is depicted as a general purpose computer, the controller 404 is programmed to perform various specialized control functions in accordance with the present principles and embodiments can be implemented in hardware, for example, as an application specified integrated circuit (ASIC). As such, the process steps described herein are intended to be broadly interpreted as being equivalently performed by software, hardware, or a combination thereof.

In one embodiment in accordance with the present principles, during operation, the controller 404 communicates with, for example, the purge stick 210 of the purge module 202 to begin the distribution of the inert gas into the gas panel 100. In one experiment, the inventors determined that by purging an averaged sized gas panel at 15 standard liters per minute (SLM) for ten (10) minutes, the oxygen in the gas panel 100 is replaced with the purging inert gas such that the flammability of a pyrophoric gas to be delivered by the gas panel is reduced. The gas panel can then be operated normally for the delivery of gases while, in one embodiment, maintaining the flow of nitrogen within the gas panel 100 at 15 SLM.

In one embodiment of the present principles, an optional sensor, such as a flow meter/sensor of the purge stick 210 (e.g., flow restrictor 320 having gas flow/gas presence sensing capabilities) included in the gas panel 100, monitors a level/flow of the inert gas in the interior portion of the gas panel 100. Such information is communicated from the gas panel 100 to the controller 404. If the controller 404 determines that a flow/presence of inert gas in the gas panel 100 is not a predetermined level, a signal is communicated to, for example, the purge stick 210 of the purge module 202 of the gas panel 100 to increase or decrease a flow of the inert gas entering the gas panel 100 using, for example, the flow restrictor 320 or the 2P valve 330 and the 3P valve 335 of the purge stick 210, to achieve a predetermined flow/presence of inert gas in the gas panel 100. For example, in one embodiment and as described above, the flow of nitrogen gas within the gas panel 100 is maintained at 15 SLM.

In another embodiment, in the gas panel system 400 of FIG. 4, a pressure switch, such as the differential pressure switch 115, in the gas panel 100 is used to monitor the pressure in the gas panel 100. In such an embodiment, the upper cut off value of the pressure for the differential pressure switch 115 is set in such a way that if air leaks occur inside the gas panel 100, the differential pressure switch 115 will trigger due to the pressure build up inside the gas panel 100 exceeding an upper threshold. That is, because in various embodiments of the present principles, the gas panel 100 is maintained in a sub-atmospheric condition, air leaks in the gas panel will cause the pressure inside the gas panel 100 to rise, which can indicate a rise in oxygen concentration inside the gas panel. In response to the sensed pressure build up inside of the gas panel 100, a signal indicating the rise in pressure may be communicated to the controller 404 and, in response, the controller 404 may communicate a signal to, for example, the purge stick 210 of the purge module 202 of the gas panel 100 to increase a distribution of the inert gas into the gas panel 100. For example, in some embodiments, an amount of inert gas delivered to the gas panel 100 may be increased by making an adjustment to the 2P valve and the 3P valve of the purge stick 210 of the inert gas purge module 202 to again reduce a concentration of oxygen in at least the portion of the gas panel 100 through which the gases are being delivered. Optionally, a speed of the exhaust pump 209 may also be increased to exhaust the leaked air from the gas panel 100 more quickly. Once the leak condition is no longer sensed by the differential pressure switch 115, the distribution of the inert gas into the gas panel 100 can be again decreased and the speed of the exhaust pump 209 can be reduced.

In some embodiments in accordance with present principles, if the air leak in the gas panel 100, as sensed by, for example the differential pressure switch 115, persists, the operation of the gas panel 100 may be stopped and the delivery of the gas to be delivered by the gas panel 100 may be shut off. That is, if after a predetermined amount of time, differential pressure switch 115 continues to detect air leaking into the gas panel 100, the controller 404 can communicate a signal to the gas panel 100 to shut down the operation of the gas panel and stop the delivery of all gases to the gas panel 100. As such, the gas panel 100 can be serviced. In one embodiment of the present principles, a signal can be communicated from the controller 404 to a service center (not shown) to indicate the need for servicing of the gas panel 100.

In another embodiment, the optional at least one leak/gas sensor(s) 219 depicted in FIG. 2 can be used to detect a gas leak in the interior portion of the gas panel 100. That is, if during operation of the gas panel 100, the at least one leak/gas sensor(s) 219 (a number of leak sensors depends on the type of gas to be delivered) detects a gas leak in the interior portion of the gas panel 100 from, for example, the at least one gas stick 203, a signal can be communicated to the controller 404 which in turn may communicate a signal to, for example, the purge stick 210 of the purge module 202 of the gas panel 100 to increase a distribution of the inert gas into the gas panel 100. The distribution of the inert gas into the interior portion of the gas panel 100 can be either turned on, if off, or increased to increase a concentration of the inert gas in the gas panel 100 to, for example, reduce the flammability of any pyrophoric gases being exhausted from the gas panel 100. For example, in some embodiments, an amount of inert gas delivered to the gas panel 100 may be increased by making an adjustment to the 2P valve and the 3P valve of the purge stick 210 of the inert gas purge module 202 to again increase a distribution of inert gas in at least the portion of the gas panel 100 in which the leak was detected.

Optionally, a rate of the exhaustion of gases from the gas panel can be increased by increasing a speed of the exhaust pump 209 to more quickly rid the interior portion of the gas panel of the leaked gas. For example, in one embodiment in accordance with the present principles, when a gas leak is sensed by the at least one leak/gas sensor(s) 219, a signal is communicated to the controller 404. The controller 404 in turn communicates a signal to the exhaust pump 209 to increase a speed of the exhaust pump to evacuate the leaked gas from the gas chamber 100. In one embodiment, the exhaust pump 209 can be run at maximum or near maximum speed to exhaust the leaked gas from the gas interior portion of the gas panel 100 as quickly as possible.

Once the leaked gas has been evacuated from the interior portion of the gas panel 100, for example after a calculated time period of inert gas distribution and exhausting of the gases as described above, a signal can be communicated from the controller 404 to, for example the purge stick 110 of the purge module 202 to reduce an amount of inert gas being distributed into the gas panel 100. Optionally, the controller 404 can also communicate a signal to the exhaust pump 209 to return the speed of the exhaust pump 209 to a normal operating speed to maintain the relatively lower pressure in the gas panel 100, which will consume less energy. By controlling an amount of the inert gas being distributed into the gas panel 100 and the pump speed (variable), a considerable amount of energy can be saved.

In some embodiments in accordance with present principles, if the gas leak in the gas panel 100, as sensed by, for example the leak/gas sensor(s) 219, persists, the operation of the gas panel 100 may be stopped and the delivery of the gas to be delivered by the gas panel 100 may be shut off. That is, if after a predetermined amount of time, the leak/gas sensor(s) 219 continue to detect leaked gas, the controller 404 can communicate a signal to the gas panel 100 to shut down the operation of the gas panel and stop the delivery of all gases to the gas panel 100. As such, the gas panel 100 can be serviced. In one embodiment of the present principles, a signal can be communicated from the controller 404 to a service center (not shown) to indicate the need for servicing of the gas panel 100.

The processes for monitoring the presence of gases in a gas panel and distributing and exhausting gases in the gas panel in accordance with the present principles described herein are not mutually exclusive. The processes and associated components can be combined in any manner to perform the described processes in a gas panel in accordance with the present principles.

Figure 6:
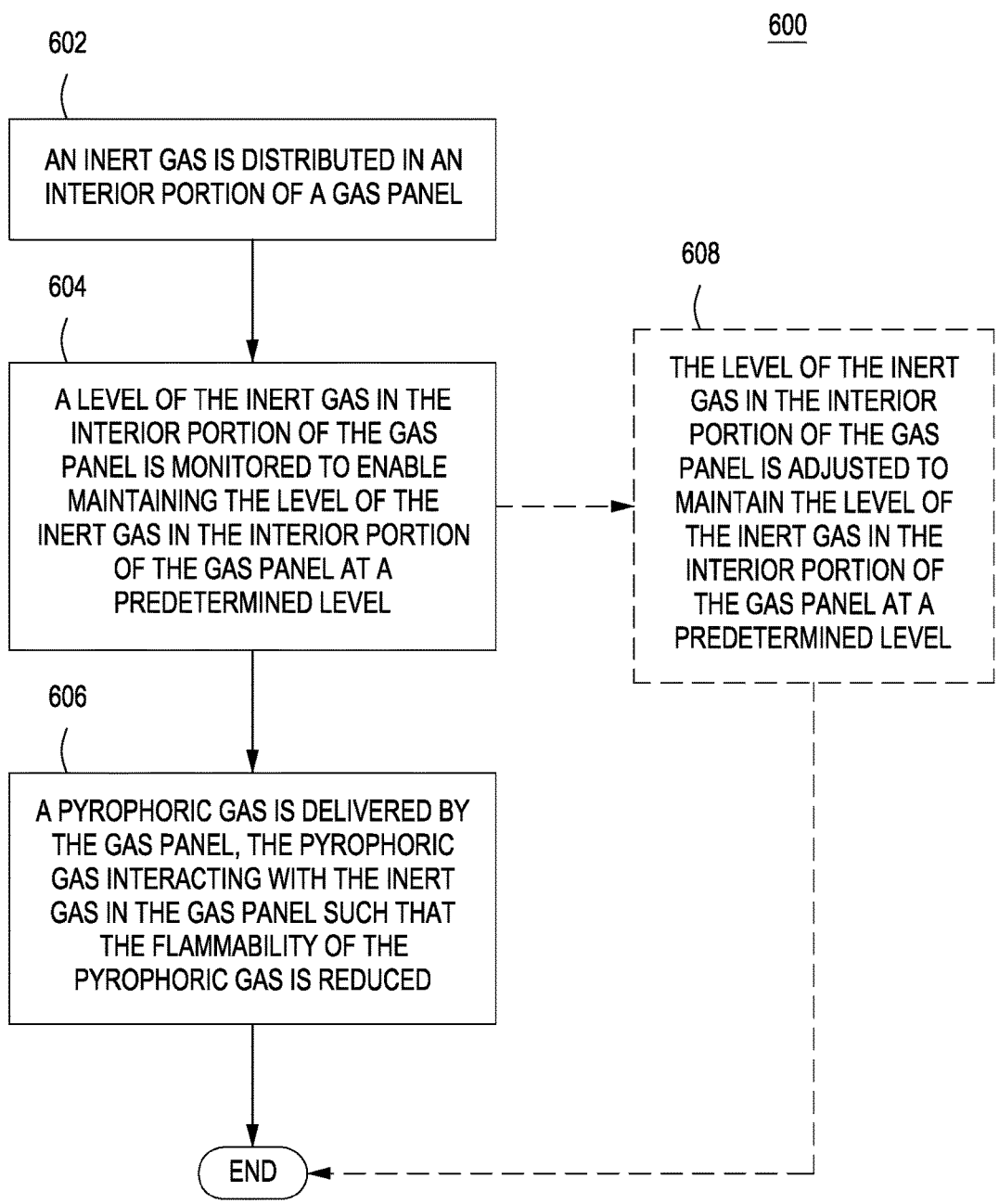
FIG. 6 depicts a flow diagram of a method for reducing exhaust requirements of a gas panel in accordance with an embodiment of the present principles.

FIG. 6 depicts a flow diagram of a method 600 for reducing exhaust requirements of a gas panel in accordance with an embodiment of the present principles. The method 600 begins at 602 during which an inert gas is distributed in an interior portion of a gas panel. The method 600 can then proceed to 604.

At 604, the gas panel is monitored for leaks. The method 600 can then proceed to 606.

At 606, in response to a detected leak, the distribution of the inert gas is increased in at least the portion of the gas panel in which the leak was detected. The method 600 can proceed to optional 608 or alternatively be exited.

At optional 608, in response to the detected leak, a rate of an exhaust pump exhausting gases from the gas panel is increased to evacuate gases in the gas panel more quickly. The method 600 can then be exited.

An additional consideration when determining the operational costs of a gas panel is the amount of exhaust required to mitigate the harmful effects of toxic gases that escape the gas panel due to leaks in the gas panel. Currently, gas panels are vented to enable air flow to dilute toxic gases that escape the gas panel through leaks in the gas panel to reduce the potential risk to operators of the gas panel. The inventors have determined that by improving the sealing of a gas panel in accordance with embodiments of the present principles described herein, an amount of gases escaping the gas panel is reduced and as such an amount of air flow needed to dilute the leaking gases is also reduced resulting in reduced costs associated with the gas panel.

FIGS. 7-10 depict three-dimensional pictorial views of sealing apparatus that can be added to a gas panel for reducing or eliminating leaks in a gas panel in accordance with various embodiments of the present principles. For example, FIG. 7a depicts a three-dimensional pictorial view of a typical bottom panel 702 for a typical gas panel. As depicted in FIG. 7a, the bottom panel 702 was designed to allow air flow through the gas panel for enabling the mitigation of high concentration levels of flammable and toxic gases in a typical gas panel. In contrast to typical bottom panels, a bottom panel in accordance with the present principles includes a reduced amount of air inlet holes or, as illustrated, no air inlet holes and, in one embodiment can also include sealing tape (not shown) around the edge of the bottom panel.

Figure 7A:
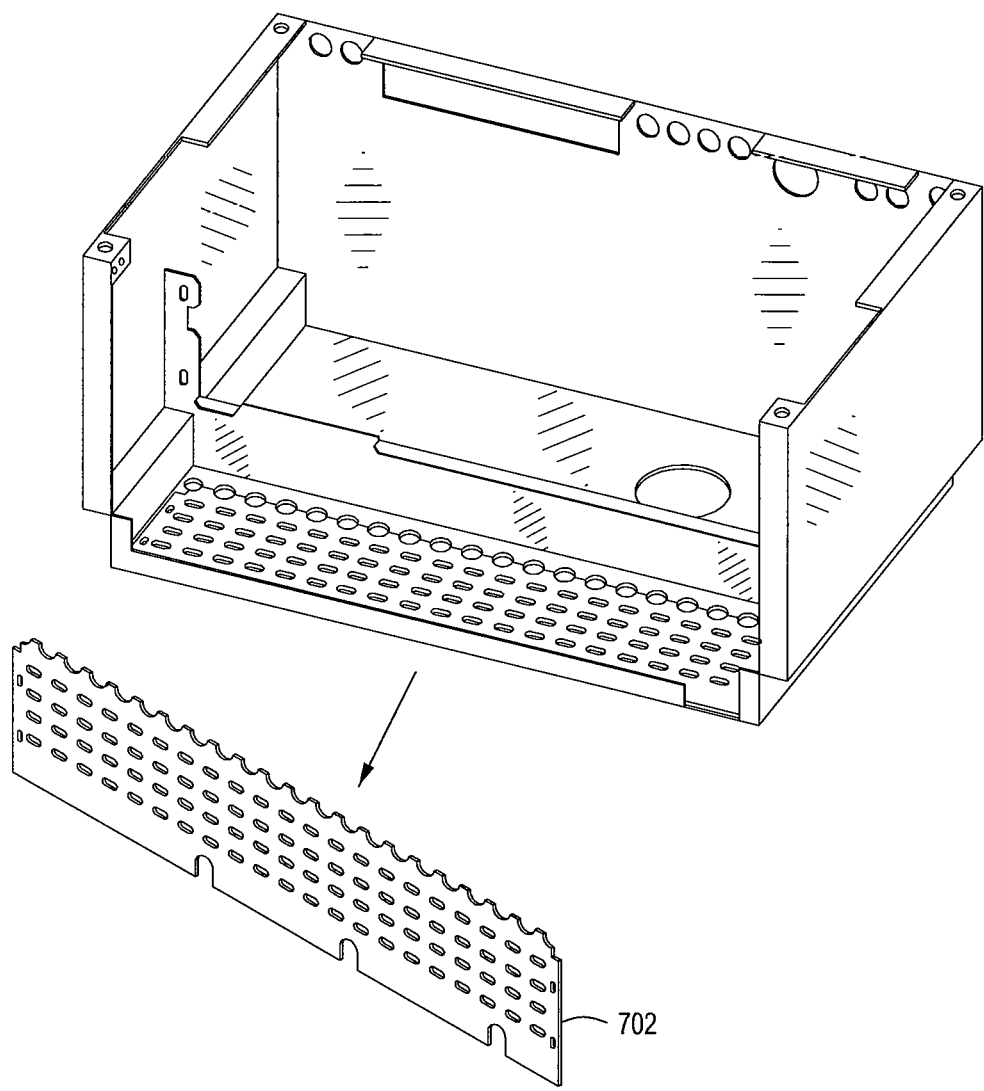
FIG. 7a depicts a three-dimensional pictorial view of a typical bottom panel for a prior art gas panel.
Figure 7B:
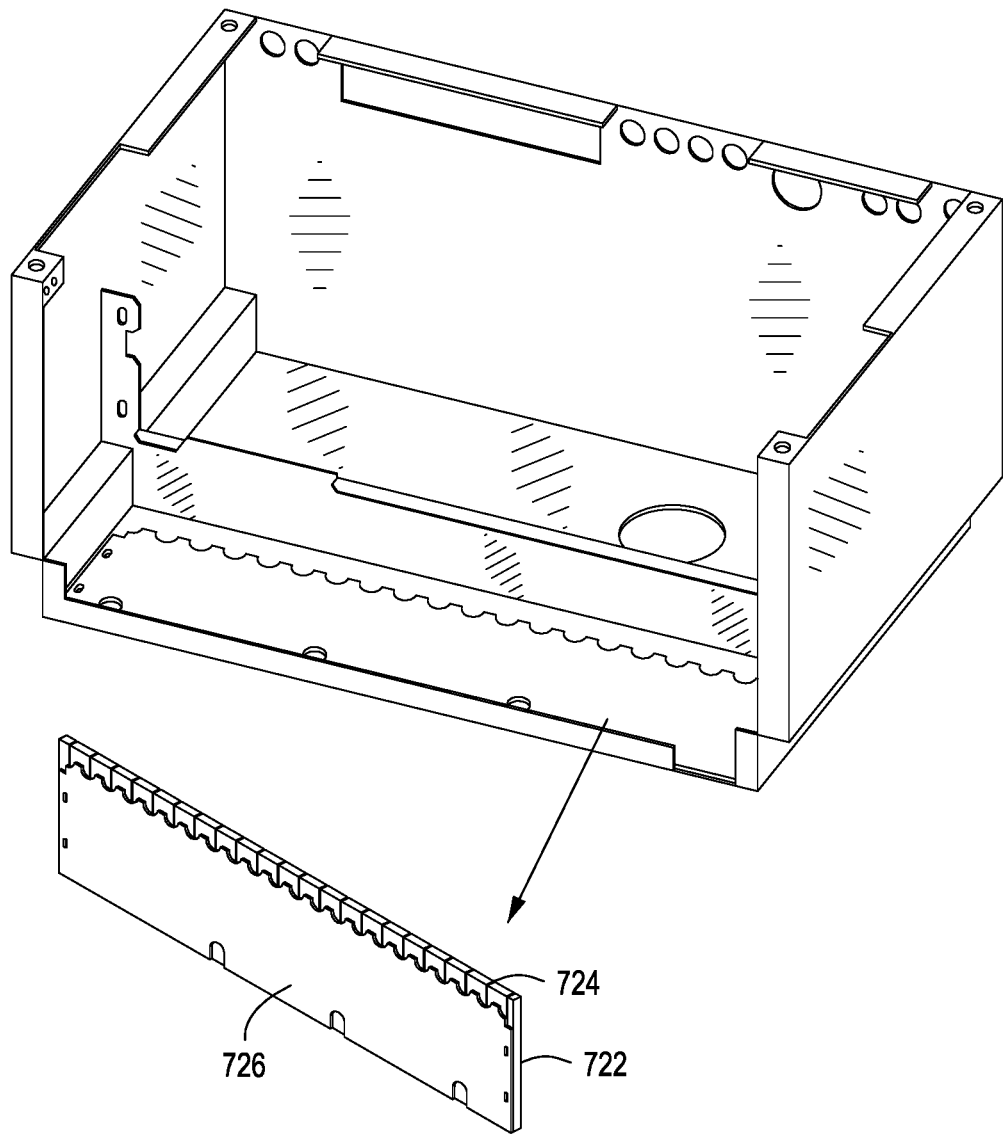
FIG. 7b depicts a three-dimensional pictorial view of an embodiment of a bottom panel for a gas panel such as the gas panel of FIG. 1 in accordance with an embodiment of the present principles.

More specifically, FIG. 7b depicts a three-dimensional pictorial view of an embodiment of a bottom panel 722 for a gas panel such as the gas panel 100 of FIG. 1 in accordance with an embodiment of the present principles. As depicted in FIG. 7b, the bottom panel 722 of FIG. 7b is designed to have no throughput holes and seals the lower portion 102 of the chamber body of the gas panel 100 of FIG. 1. In one exemplary embodiment, the bottom panel 722 can be made out of a backing portion 724 comprising silicone foam having a thickness of ⅜ of an inch and a front portion 726 comprising a ¾ inch thick CRS (cold rolled steel) sheet.

Figure 8:
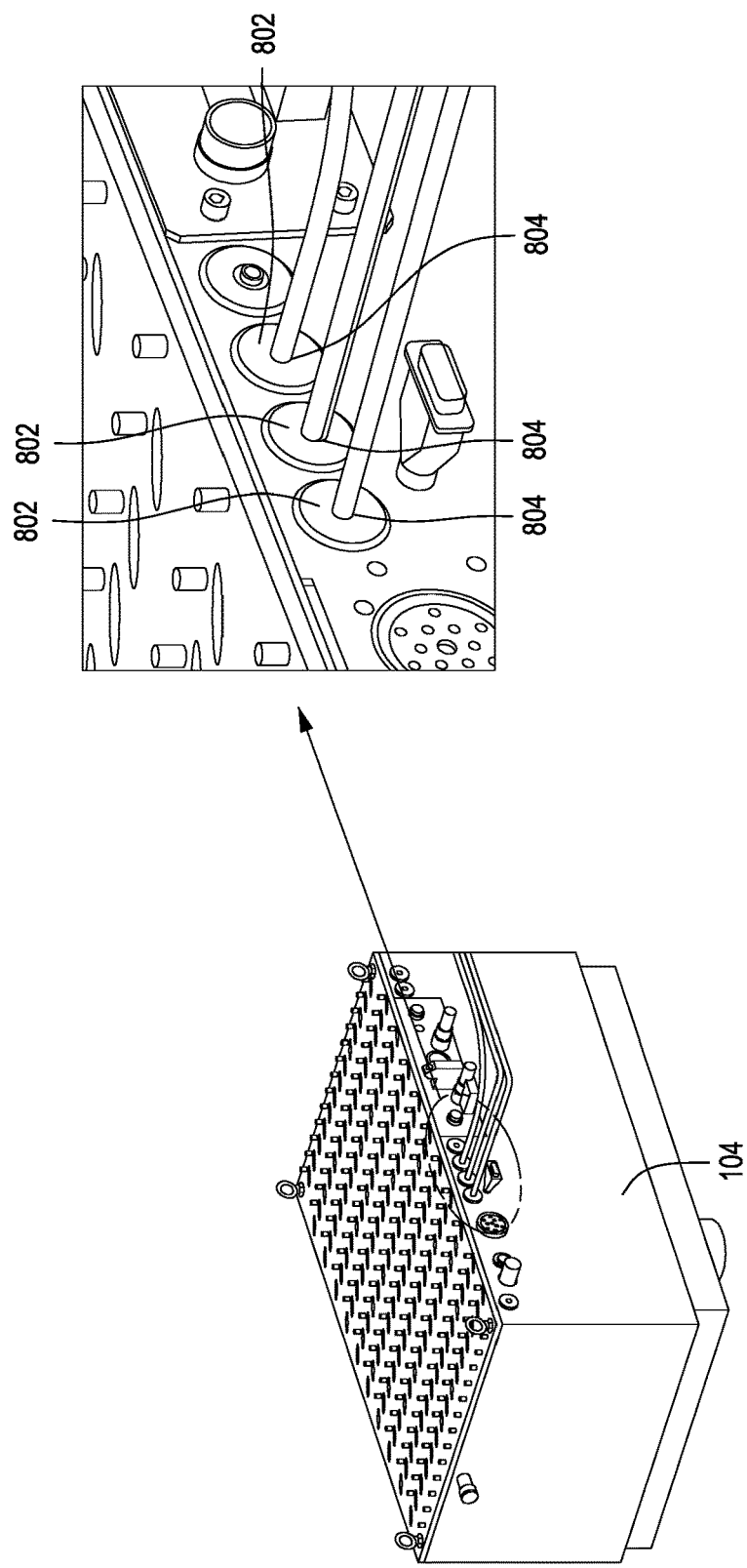
FIG. 8 depicts a high level block diagram of the back portion of a chamber body of the gas panel of FIG. 1 including a plurality of grommets installed in gas line outlet holes in accordance with an embodiment of the present principles.

The inventors contemplated further means for sealing a gas panel of the present principles to further reduce a leak of gases associated with the gas panel. For example, FIG. 8 depicts a high level block diagram of the back portion 104 of the chamber body of the gas panel 100 in accordance with an embodiment of the present principles. In the embodiment of the gas panel 100 of FIG. 8, a plurality of grommets, collectively 802, are installed in the gas line outlet holes 804 in the back portion 104 of the chamber body of the gas panel 100 to reduce or eliminate leaks in the gas panel associated with the outlet holes 804. In one exemplary embodiment, the grommets 802 can comprise Military Specification Buna-N rubber grommets.

Figure 9:
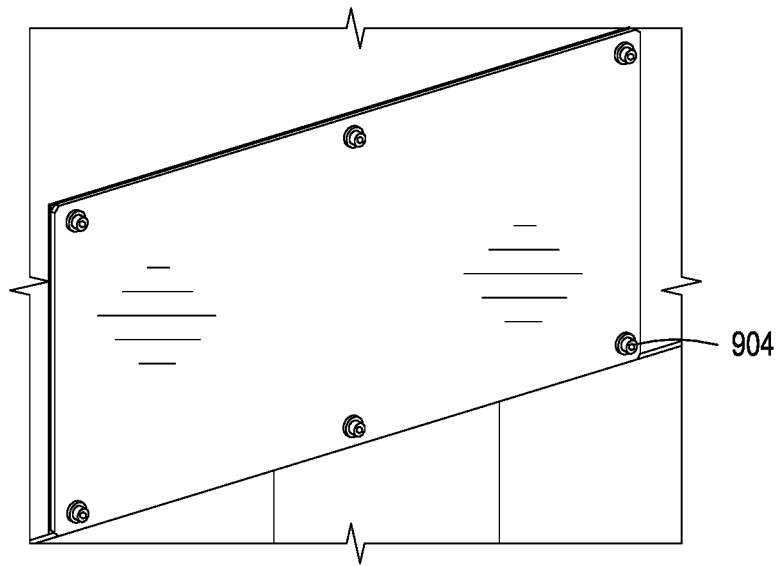
FIG. 9 depicts a three-dimensional pictorial view of door in a chamber body of the gas panel of FIG. 1 including fasteners and tape for sealing leaks in accordance with an embodiment of the present principles.
Figure 9:
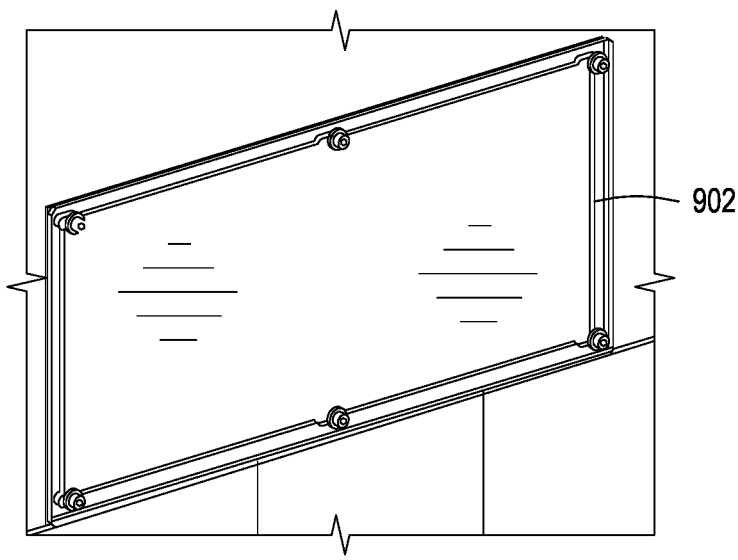

In an embodiment of a gas panel in accordance with the present principles depicted in FIG. 9, cut-outs and doors of the gas panel are sealed using, for example, silicone tape 902. As further depicted in FIG. 9, fasteners for affixing the cut-outs and doors to the gas panel can also be sealed using, for example, thread seal 904. As such, potential leaks associated with cut-outs and doors and the hardware used to affix such cut-outs and doors to the gas panel can be reduced or eliminated.

Figure 10:
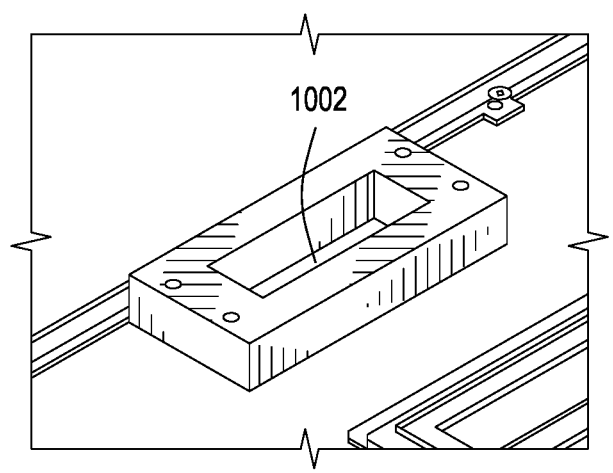
FIG. 10 depicts a three-dimensional pictorial view of a slot in a chamber body of the gas panel of FIG. 1 for routing cables and connectors in which an interface can be provided for routing the cables and connectors through the slot in accordance with an embodiment of the present principles.

In an embodiment of a gas panel in accordance with the present principles depicted in FIG. 10, at least one slot 1002 for cables and connectors is provided in the enclosure of the gas panel 100. In such embodiments, a respective interface (not shown) can be provided for routing the cables and connectors through the slot 1002.

Other sealing means and apparatuses, such as seal washers, inlet and outlet couplings and the like can be used to reduce or eliminate potential leaks in a gas panel in accordance with the present principles. In principle, the inventors determined that by reducing leaks associated with the operation of the gas panel 100, for example, by at least the means and methods described above at least with respect to FIGS. 7-10, alone or in any combination, an amount of gas in the gas panel that interacts with an outside environment is reduced. In addition, by reducing leaks, an amount of oxygen that leaks into the gas panel can be minimized thus reducing a concentration of oxygen within the gas panel. As such, an amount of exhaust required for a gas panel of the present principles is also reduced, thus, reducing the cost and improving the eco-efficiency associated with a gas panel in accordance with the present principles.

The inventors further determined that a reduction in the amount of leaks in a gas panel of the present principles at least as described above enables a gas panel in accordance with the present principles to more easily be kept under sub-atmospheric conditions which further reduces an amount of gas leak from the gas panel.

Figure 11:
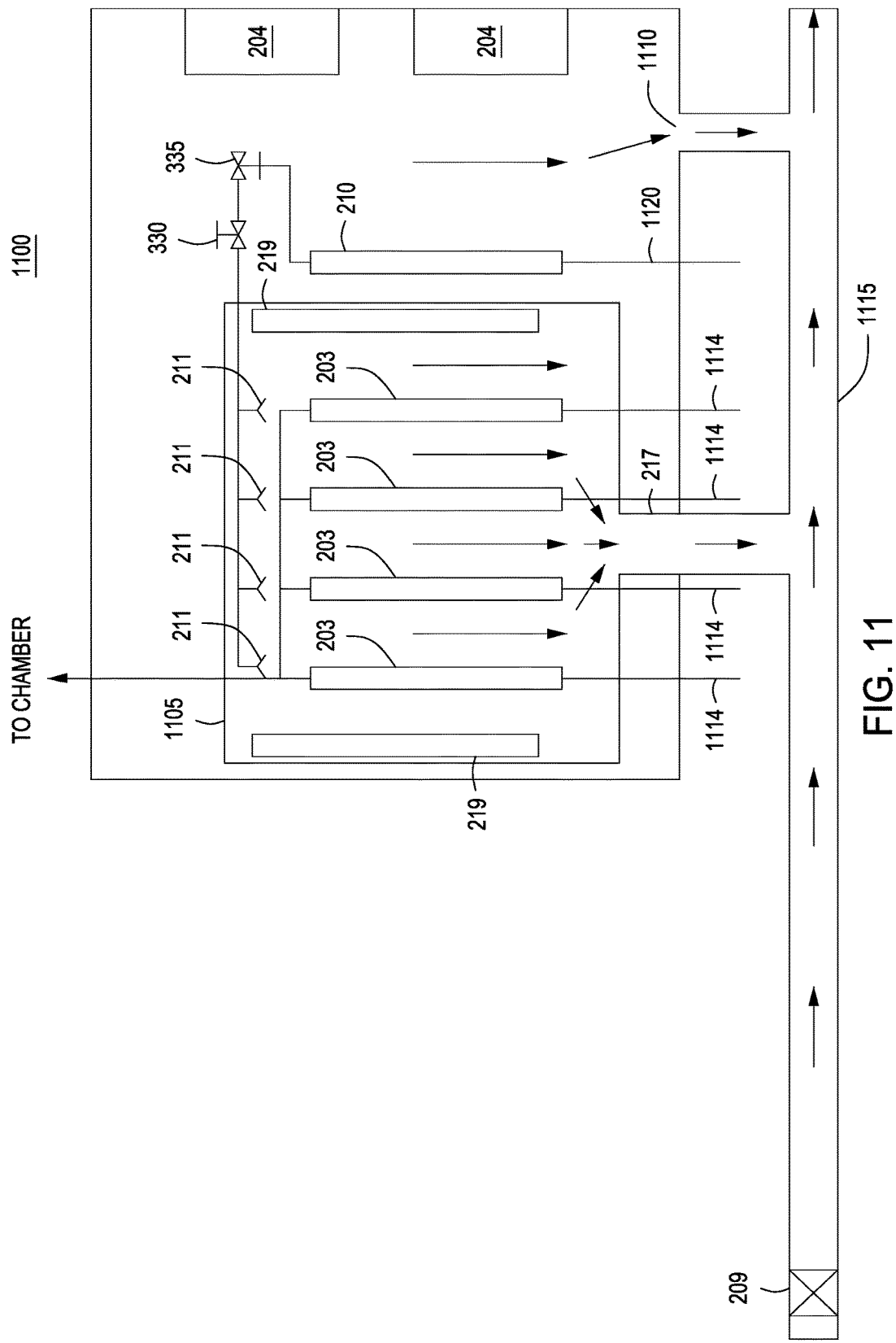
FIG. 11 depicts an embodiment of a gas panel in accordance with an alternate embodiment of the present principles.

FIG. 11 depicts an embodiment of a gas panel 1100 in accordance with the present principles in which flammable and/or toxic gases to be delivered by a gas panel are isolated from the electrical components of the gas panel. The gas panel 1100 of FIG. 11 is similar to the gas panel 200 of FIG. 2 except that in the embodiment of the gas panel 1100 of FIG. 11, the plurality of gas sticks 203 for receiving a gas to be delivered by the gas panel 1100 are isolated from any electrical components of the gas panel 1100 by a gas compartment enclosure 1105. The gas panel 1100 of FIG. 11 illustratively comprises a gas component enclosure 1105 including at least one gas stick, collectively 203, having respective inlets 1111, at least one inert gas diffuser/nozzle, collectively 211, a first exhaust port 217 and, optionally, at least one leak/gas sensor, collectively 219. Outside of the gas component enclosure 1105, the gas panel 1100 comprises a purge stick 210 having an inlet 1120, at least one electrical component, collectively 204, for providing at least power, communication and control to the purge stick 210 and optionally other components of the gas panel 1100, a second exhaust port 1110 and an exhaust pump 209, which illustratively in the embodiment of the gas panel 1100 of FIG. 11 comprises a variable speed exhaust pump. The gas panel 1100 of FIG. 11 further illustratively comprises a common exhaust line 1115. In the embodiment of the gas panel 1100 of FIG. 11, the exhaust pump 209 is located in the common exhaust line 1115.

The inventors determined that by isolating all of the electrical components and cables from a gas to be delivered by the gas panel 1100, the risk of igniting pyrophoric gases to be delivered by the gas panel 1100 is reduced and as such exhaust requirements for a gas panel are reduced, thus, reducing the cost and improving eco-efficiency associated with the gas panel in accordance with the present principles.

During operation, a gas to be delivered by the gas panel 1100 runs through the at least one gas stick 203. During the delivery, the at least one gas diffuser 211 (or nozzle) can be shut off completely or alternatively can be providing a relatively small amount of inert gas to the gas component enclosure 1105 to distribute inert gas within the gas component enclosure 1105. The gas component enclosure 1105 is exhausted via the first exhaust port 217 at low rate using the exhaust pump 209 to keep the gas component enclosure 1105 in a condition of lesser pressure than the interior portion of the gas panel 1100 which in turn helps to reduce the amount of any gases leaked by the at least one gas stick 203 coming out of the gas component enclosure 1105, as the pressure outside of the gas component enclosure 1105 will be relatively higher than the pressure in the inside portion of the gas panel 1100. The exhaust from the gas component enclosure 1105 travels along the common exhaust line 1115 to outside the gas panel 1100.

If during operation, the optional at least one leak/gas sensor(s) 219 detects any leaks in the gas component enclosure 1105 from the at least one gas stick 203, the distribution of the inert gas into the gas component enclosure 1105 can be either turned on, if off, or increased to increase a concentration of inert gas in the gas component enclosure 1105 to, for example, reduce the flammability of any pyrophoric gases being exhausted from the gas panel 1100 via the second exhaust port 1110. In one embodiment, an amount of inert gas delivered to the gas component enclosure 1105 is controlled using the 2P valve 330 and the 3P valve 335 of the purge stick 210 of the purge module 202 (refer to FIGS. 2 and 3).

Optionally during a gas leak, a speed of the exhaust pump 209 can be increased to more quickly rid the gas compartment enclosure 1105 of the leaked gas. In one embodiment of the present principles, during a detected leak, the exhaust pump 209 can be run at maximum or near maximum speed to exhaust the leaked gas from the gas component enclosure 1105 as quickly as possible.

When the leaked gases are evacuated from the gas component enclosure 1105, for example, after a calculated time period of inert gas distribution and exhausting of gases as described above, an amount of inert gas being distributed can be reduced as previously described herein. In addition, the speed of the exhaust pump 209 can be returned to a normal operating speed to maintain the relatively lower pressure in the gas component enclosure 1105, which will consume less energy. By controlling the pump speed (variable) and an amount of the inert gas being distributed, a considerable amount of energy can be saved.

The gas panel 1100 of FIG. 11 can further include at least one inert gas diffuser/nozzle (not shown), outside of the gas component enclosure 1105 and within the interior portion of the gas panel 1100, to purge the interior portion of the gas panel 1100 with inert gas. Such purging can reduce a concentration of oxygen within the interior portion of the gas panel 1100 and, as such, reduce the flammability of any pyrophoric gases that leak into the interior portion of the gas panel 1100. The distribution of the inert gas into the interior portion of the gas panel 1100 can also dilute a concentration of any toxic gases that leak into the interior portion of the gas panel 1100. Such gases can then be exhausted from the interior portion of the gas panel 1100 using the exhaust pump 209, the common exhaust line 1115 and the second exhaust port 1110 in accordance with the present principles.

Figure 12:
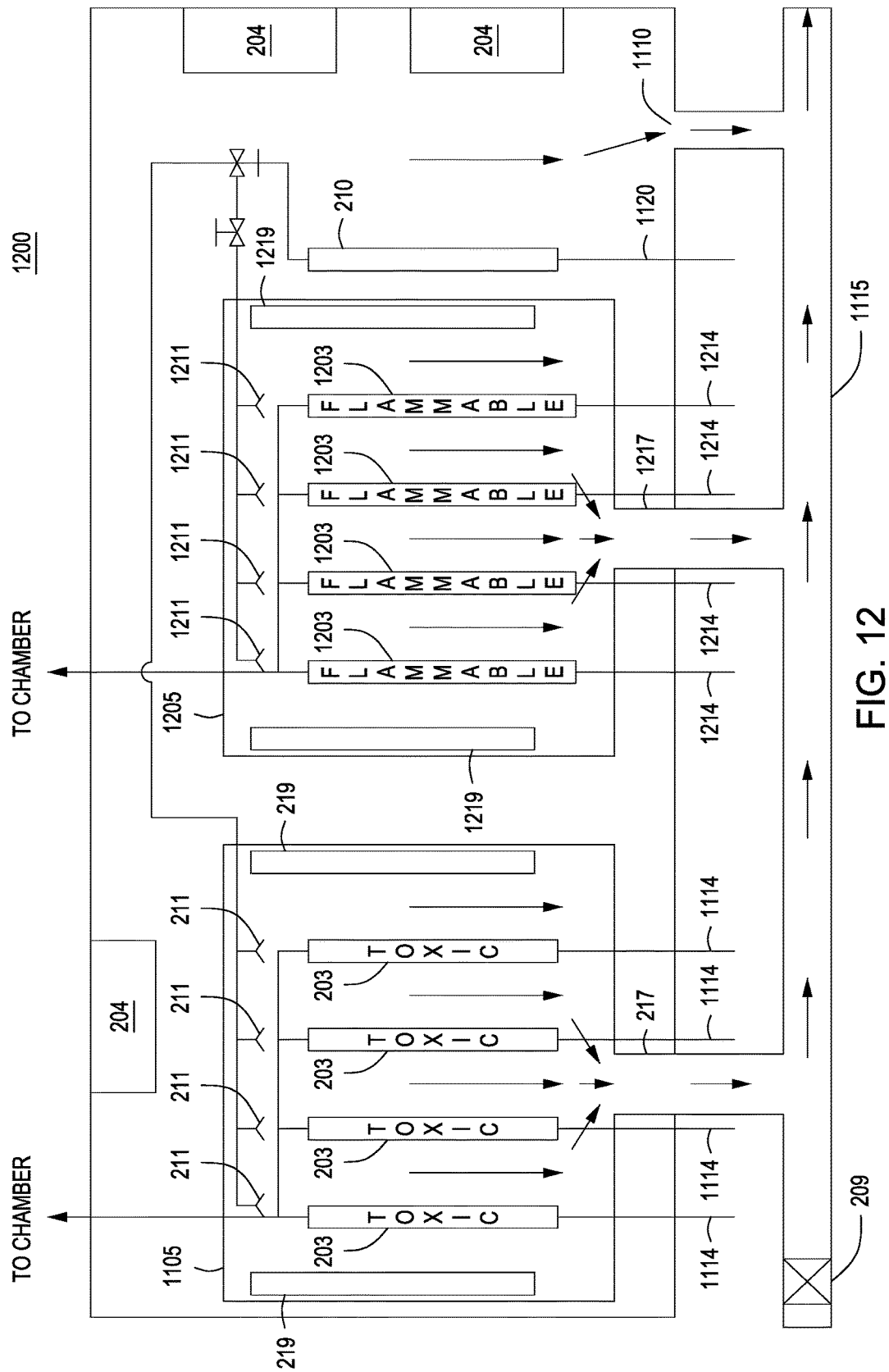
FIG. 12 depicts an embodiment of a gas panel in accordance with an alternate embodiment of the present principles.

FIG. 12 depicts an embodiment of a gas panel 1200 in accordance with another embodiment of the present principles in which flammable and/or toxic gases to be delivered by a gas panel are isolated from the electrical components of the gas panel. The gas panel 1200 of FIG. 12 is similar to the gas panel 1100 of FIG. 11 except that in the embodiment of the gas panel 1200 of FIG. 12, multiple gases are capable of being delivered by the gas panel 1200. The gas panel 1200 of FIG. 12 illustratively comprises a first gas component enclosure 1105 including at least one gas stick, collectively 203, having respective inlets 1114, at least one inert gas diffuser/nozzle, collectively 211, a first exhaust port 217 and, optionally, at least one leak/gas sensor, collectively 219.

The gas panel 1200 of FIG. 12 further illustratively comprises a second gas component enclosure 1205. The second gas component enclosure 1205 illustratively comprises at least one gas stick, collectively 1203, having respective inlets 1214, at least one inert gas diffuser/nozzle, collectively 1211, a third exhaust port 1217 and, optionally, at least one leak/gas sensor, collectively 1219.

Outside of the gas component enclosures 1105 and 1205, the gas panel 1200 comprises a purge stick 210 having a respective inlet 1120, at least one electrical component, collectively 204, for providing at least power, communication and control to the purge stick 210 and optionally other components of the gas panel 1200, a second exhaust port 1110 and an exhaust pump 209, which illustratively in the embodiment of the gas panel 1200 of FIG. 12 comprises a variable speed exhaust pump. The gas panel 1200 of FIG. 12 further illustratively comprises a common exhaust line 1115. In the embodiment of the gas panel 1200 of FIG. 12, the exhaust pump 209 is located in the common exhaust line 1115.

The gas panel 1200 of FIG. 12 is capable of delivering more than one gas at a time. For example, in the embodiment of the gas panel 1200 of FIG. 12, the gas panel 1200 is illustratively delivering a toxic gas in the gas component enclosure 1105 and a flammable gas in the gas component enclosure 1205. Although in the embodiment of FIG. 12, the gas panel 1200 is depicted as illustratively comprising two gas component enclosures 1105 and 1205, in alternate embodiments in accordance with the present principles, a gas component enclosure in accordance with the present principles can comprise any number of gas component enclosures for delivering gases in accordance with the present principles.

Each gas component enclosure 1105 and 1205 of the gas panel 1200 of FIG. 12 operate similar to the gas component enclosure 1105 of the gas panel 1100 as described above with respect to FIG. 11.

As described above with respect to FIG. 11, the gas panel 1200 of FIG. 12 can further include at least one inert gas diffuser/nozzle (not shown), outside of the gas component enclosures 1105 and 1205 and within the interior portion of the gas panel 1200, to purge the interior portion of the gas panel 1200 with inert gas. Such purging can reduce a concentration of oxygen within the interior portion of the gas panel 1200 and, as such, reduce the flammability of any pyrophoric gases that leak into the interior portion of the gas panel 1200. The purging of the interior portion of the gas panel 1200 with inert gas can also dilute a concentration of any toxic gases that leak into the interior portion of the gas panel 1200. Such gases can then be exhausted from the interior portion of the gas panel 1200 using the exhaust pump 209, the common exhaust line 1115 and the second exhaust port 1110 in accordance with the present principles.

In accordance with various embodiments of the present principles, a volume of a gas panel is minimized, for example, to minimize an amount of inert gas required to purge the gas panel and/or an amount of exhaust needed to evacuate at least a portion of a gas panel in which a gas was to be delivered. By minimizing a volume of a gas panel in accordance with the present principles, a cost associated with operating the gas panel can be reduced.

While the foregoing is directed to embodiments of the present principles, other and further embodiments may be devised without departing from the basic scope thereof.

The invention claimed is:

1. An apparatus for delivering gases, comprising:
   a gas stick to deliver to at least a portion of the apparatus at least one gas to be delivered by the apparatus;
   a purge module including a purge stick and a plurality of diffusers to distribute an inert gas in at least one portion of the apparatus in which a gas to be delivered by the apparatus is present;
   at least one pressure sensor to detect leaks in the apparatus; and
   a controller, the controller including a processor and a memory coupled to the processor, the memory having stored therein instructions executable by the processor to configure the controller to:
      communicate a signal to cause the purge module to distribute the inert gas in the at least one interior portion of the apparatus;
      monitor for leaks in the at least one interior portion of the apparatus using signals received from the at least one pressure sensor; and
      in response to a detected leak, communicate a signal to cause the purge module to increase the distribution of the inert gas in at least the portion of the apparatus in which the leak was detected.

2. The apparatus of claim 1, comprising an exhaust port and an exhaust pump to exhaust gases out of the apparatus and to maintain the apparatus in a sub-atmospheric condition, wherein in response to a detected leak, a speed of the exhaust pump is increased.

3. The apparatus of claim 1, wherein the inert gas comprises nitrogen gas.

4. The apparatus of claim 1, wherein the purge stick comprises a purge valve to control an amount of inert gas to be distributed.

5. The apparatus of claim 1, wherein the at least one pressure sensor comprises at least one differential pressure switch to monitor a pressure in the at least one portion of the apparatus, wherein, in response to a pressure change sensed by the differential pressure switch, the distribution of the inert gas by the purge stick is increased in at least a portion of the apparatus in which the pressure change was sensed.

6. The apparatus of claim 5, comprising an exhaust port and an exhaust pump to exhaust gases out of the apparatus, wherein, in response to a pressure change sensed by the differential pressure switch, a rate of an exhaustion of gases from the apparatus is increased in at least a portion of the apparatus in which the pressure change was sensed.

7. The apparatus of claim 1, comprising;
   a gas component enclosure to isolate gas delivery components from electrical components in the apparatus, wherein the gas component enclosure includes at least one diffuser to distribute the inert gas in the gas component enclosure and at least one sensor to detect gas leaks in the gas component enclosure.

8. The apparatus of claim 1, further comprising at least one of a bottom panel for the apparatus having no inlet holes, grommets installed in gas line inlet and outlet holes on the apparatus, seal washers added to fasteners of the apparatus, couplings for facility inlet and outlet lines, a clean dry air (CDA) lines interface to reduce potential leaks associated with CDA lines of the apparatus, or a cable and connector interface to route cables and connectors through a slot in the apparatus.

9. An apparatus for delivering gases, comprising:
   a gas component enclosure to isolate gas delivery components from electrical components in the apparatus, wherein the gas component enclosure comprises:
      a gas stick to deliver to at least the gas component enclosure of the apparatus at least one gas to be delivered by the apparatus;
      a plurality of diffusers to distribute an inert gas in at least the gas component enclosure of the apparatus in which a gas to be delivered by the apparatus is present; and
      an exhaust port to exhaust gases out of the gas component enclosure to maintain a continuous flow of the inert gas in the gas component enclosure;
   a purge stick to provide inert gas to at least a portion of the apparatus;
   at least one pressure sensor to detect leaks in at least a portion of the apparatus; and
   a controller, the controller including a processor and a memory coupled to the processor, the memory having stored therein instructions executable by the processor to configure the controller to:
      communicate a signal to cause the purge module to distribute the inert gas in the at least one interior portion of the apparatus;
      monitor for leaks in the at least one interior portion of the apparatus using signals received from the at least one pressure sensor; and
      in response to a detected leak, communicate a signal to cause the purge module to increase the distribution of the inert gas in at least the portion of the apparatus in which the leak was detected.

10. The apparatus of claim 9, wherein the at least one pressure sensor comprises at least one differential pressure switch to detect pressure changes in the apparatus, wherein, in response to a pressure change detected by the at least one differential pressure switch, the distribution of the inert gas by at least one of the purge stick and at least one of the plurality of diffusers is increased in at least the gas component enclosure.

\* \* \* \* \*